United States Patent
Pakeriasamy

[19]

[11] Patent Number: 5,848,702
[45] Date of Patent: Dec. 15, 1998

[54] TRAY WITH FLIPPABLE COVER

[75] Inventor: Saragarvani Pakeriasamy, San Jose, Calif.

[73] Assignee: Advanced Micro Devices, Inc., Sunnyvale, Calif.

[21] Appl. No.: 869,963

[22] Filed: Jun. 5, 1997

[51] Int. Cl.[6] ................................. B65D 73/02
[52] U.S. Cl. ................. 206/725; 206/728; 220/4.24
[58] Field of Search .................... 206/722, 723, 206/725, 791, 558, 561, 564, 508, 509, 486, 726–728; 220/4.24; 229/119, 120

[56] References Cited

U.S. PATENT DOCUMENTS

| | | | |
|---|---|---|---|
| 3,552,595 | 1/1971 | Gerner | 206/725 |
| 4,173,286 | 11/1979 | Stanko | 220/4.24 |
| 5,026,303 | 6/1991 | Matsuoka et al. | 206/724 |
| 5,103,976 | 4/1992 | Murphy | 206/725 |
| 5,165,583 | 11/1992 | Kouwenberg | 220/4.24 |
| 5,492,223 | 2/1996 | Boardman et al. | |
| 5,551,572 | 9/1996 | Nemoto | 206/723 |

*Primary Examiner*—Paul T. Sewell
*Assistant Examiner*—Luan K. Bui
*Attorney, Agent, or Firm*—Davis Chin

[57] ABSTRACT

A μBGA carrier for packing and shipping of a plurality of μBGA packages is specially adapted for facilitating the inspection of the solder balls on the bottom surfaces of the μBGA packages. The carrier consists of a tray member having a plurality of first pockets disposed therein for packing and storing the plurality of μBGA packages, and a lid member having a plurality of second pockets formed therein. The second pockets are vertically aligned with corresponding ones of the plurality of first pockets in the tray member when the lid member is placed on top of the tray member. The carrier can be flipped upside-down so that when the tray member is removed the solder balls are facing upwardly to allow inspection of the same.

4 Claims, 3 Drawing Sheets

TRAY WITH FLIPPABLE COVER

BACKGROUND OF THE INVENTION

This invention relates generally to packaging systems for semiconductor integrated circuits and more particularly, it relates to a novel tray with a flippable cover of a unique construction for packing and shipping of a plurality of μBGA packages which is specially adapted for facilitating the inspection of the solder balls on the bottom surfaces of the μBGA packages.

In view of the trend for higher and higher packing densities for semiconductor integrated circuits or chips, there has been developed in recent years by electronic manufacturers extremely miniaturized rectangular plate-shaped parts of the type having no terminal leads, such as pin grid array packages. Some of these types of pin grid array package structures are formed with solder balls on their bottom surface rather than with external terminal pins and are referred to as "ball grid arrays" (BGA) packages. Over the years, these BGA packages of this type are becoming even smaller with extraordinary small outer dimensions and are sometimes referred to as "micro ball grid arrays" (μBGA) packages. For example, a typical μBGA package having forty-four solder balls on its bottom surface may have a length dimension of about 11 mm, a width dimension of about 6 mm, and a thickness of approximately 2 mm.

During the manufacturing of the μBGA packages, these packages are stored in and transported to and from various types of processes or manufacturing equipment for carrying out different manufacturing or assembling steps. For instance, the μBGA packages may be assembled, marked, tested, inspected, and the like during which time the packages are handled and transported between the various manufacturing processes and/or machines. Further, after the processing steps have been completed the μBGA packages are also packed and transported from a chip manufacturer's site to an assembly station at a customer's site where further assembly operations are performed.

Heretofore, there is known in the prior art of a chip carrier tray with a cover having a plurality of separate compartments or pockets for accommodating a number of individual μBGA packages spaced apart from each other. Such a prior art chip carrier tray with a cover is illustrated in FIG. 1. The chip carrier tray 2 and the cover 4 are both formed of a general square-shaped configuration. The tray 2 includes a plurality of separate compartments 6 each being capable of holding therein a single μBGA package 8. However, this prior art chip carrier tray with cover suffers from the disadvantage that the cover must be removed and each of the individual μBGA packages in the separate compartments of the carrier tray must then be manipulated in order to inspect the solder balls on the respective bottom surfaces. Thus, this inspection process has become a very time-consuming and costly task to perform.

Therefore, it would be desirable to provide an improved chip carrier tray and flippable cover for effectively and efficiently packing and/or shipping a plurality of μBGA packages so as to facilitate their handling and transportation during the various steps of manufacturing and/or assembly and subsequent shipping to the customer. Further, it would be expedient that the cover is flippable so as to facilitate the inspection of the solder balls on the bottom surfaces of the μBGA packages.

SUMMARY OF THE INVENTION

It is a general object of the present invention to provide an improved μBGA carrier of a generally square-shaped configuration which is relatively simple and economical to manufacture and assemble, but yet overcomes the disadvantages of the prior art BGA carriers.

It is an object of the present invention to provide an improved chip carrier tray and cover for effectively and efficiently packing and/or shipping a plurality of μBGA packages so as to facilitate their handling and transportation during the various steps of manufacturing and/or assembly and subsequent shipping to a customer.

It is another object of the present invention to provide an improved chip carrier formed of a tray and a cover in which the cover is flippable so as to facilitate the inspection of the solder balls on the bottom surfaces of the μBGA packages.

It is still another object of the present invention to provide an improved μBGA carrier for packing and shipping of a plurality of μBGA packages which includes a tray member having a plurality of first pockets and a lid member having a plurality of second pockets aligned with corresponding ones of the plurality of first pockets.

It is yet still another object of the present invention to provide an improved μBGA carrier which is made of an inexpensive material and construction, but yet is relatively durable and re-usable.

In accordance with these aims and objectives, the present invention is concerned with the provision of an improved μBGA carrier for packing and shipping of a plurality of μBGA packages which includes a substantially square-shaped tray member and a substantially square-shaped lid member. The tray member is formed of a ledge portion and a centrally raised platform surrounded on each side by the ledge portion. The centrally raised platform has a plurality of first pockets disposed therein for packing and storing the plurality of μBGA packages. The lid member is formed of a raised lip portion and a central cavity portion surrounded on each side by the lid portion. The central cavity portion has a plurality of second pockets formed therein which are vertically aligned with corresponding ones of the plurality of first pockets in the tray member when the lid member is placed on top of the tray member. The μBGA carrier is flippable upside down so that when the tray member is removed the solder balls on the bottom surfaces thereof are facing upwardly to facilitate inspection of the same.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
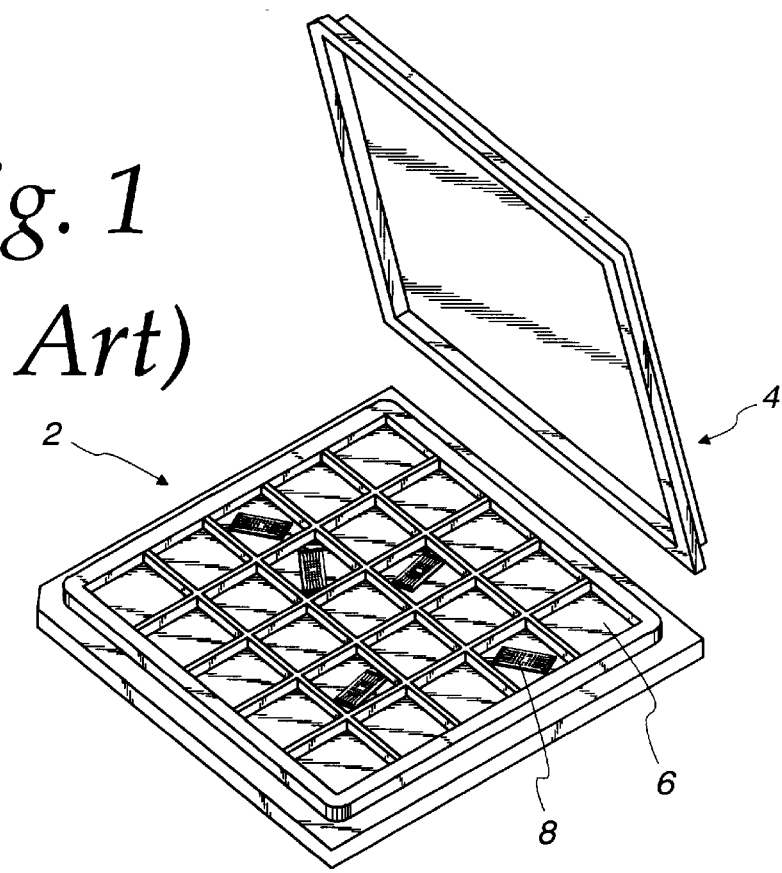
FIG. 1 is an exploded, perspective view of a chip carrier tray with cover of the prior art.
Figure 2:
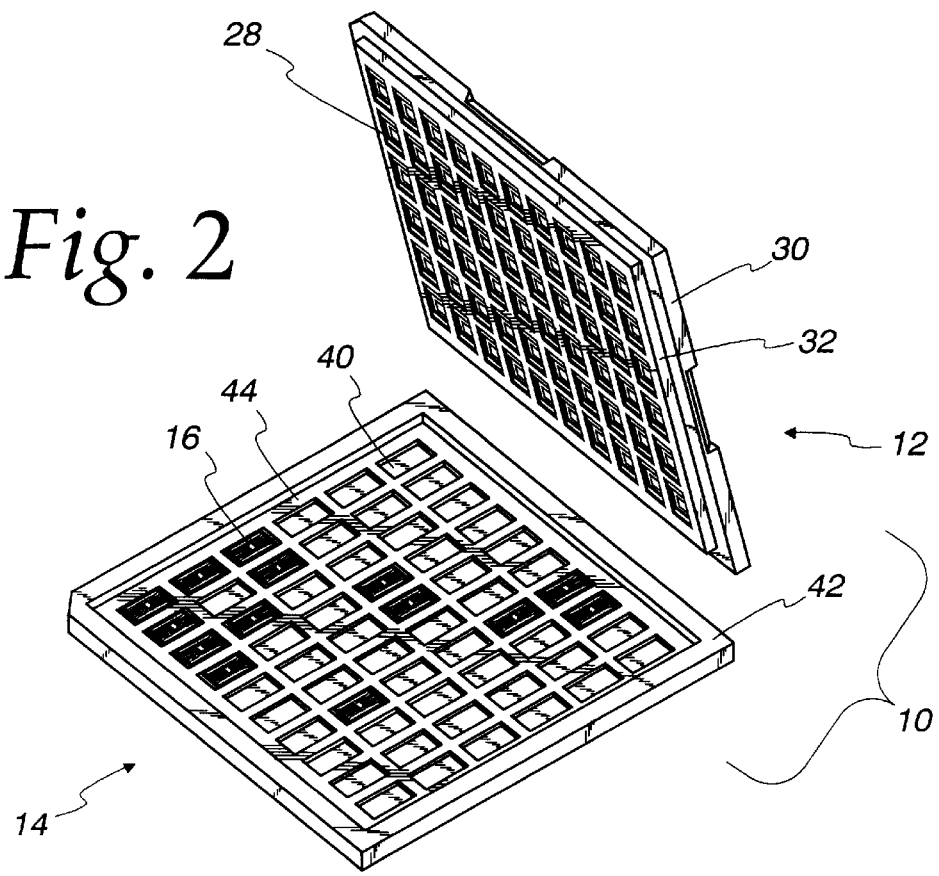
FIG. 2 is an exploded, perspective view of a chip carrier tray with a flippable cover, constructed in accordance with the principles of the present invention.
Figure 3:
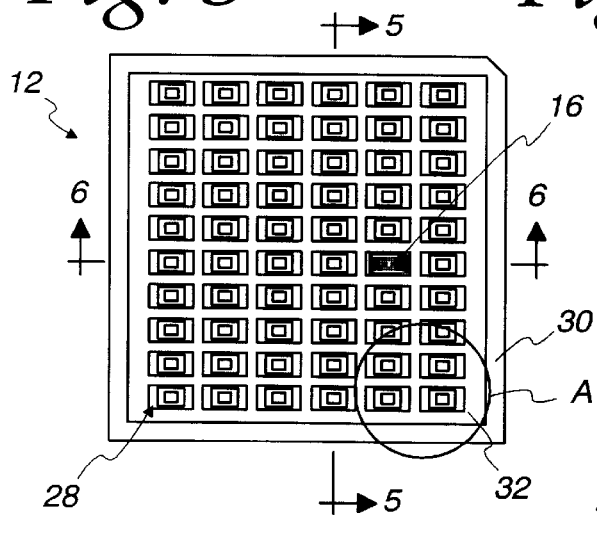
FIG. 3 is a top plan view of the carrier tray of FIG. 2.
Figure 4:
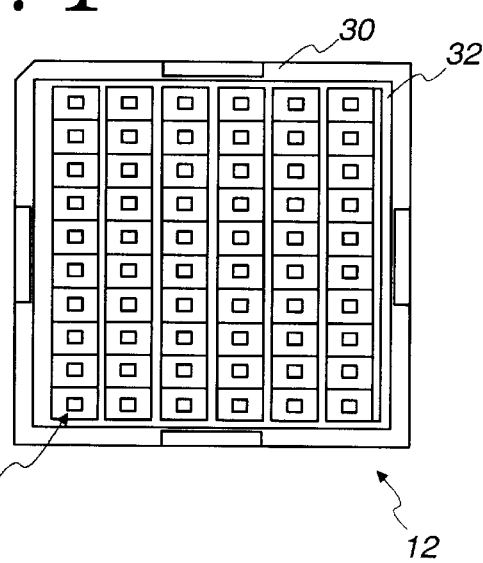
FIG. 4 is a bottom plan view of the carrier tray of FIG. 2.
Figure 5:
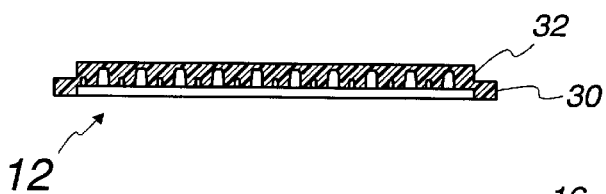
FIG. 5 is a cross-sectional view of the carrier tray, taken along the lines 5—5 of FIG. 3.
Figure 6:
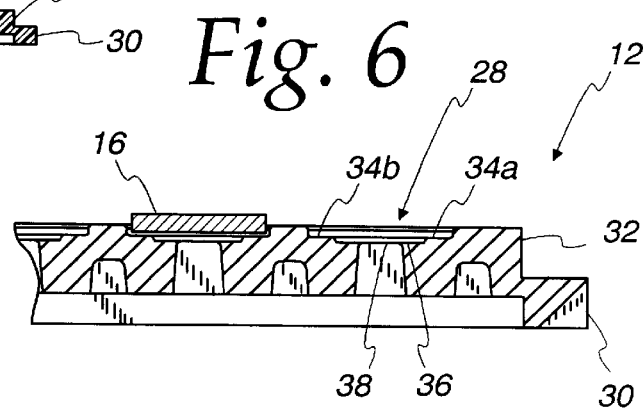
FIG. 6 is a cross-sectional view of the carrier tray taken along the lines 6—6 of FIG. 3.
Figure 7:
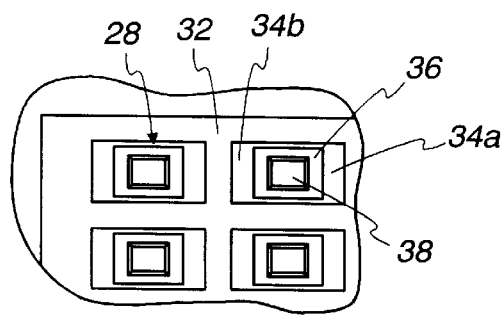
FIG. 7 is an enlarged view of the encircled area A of FIG. 3.
Figure 8:
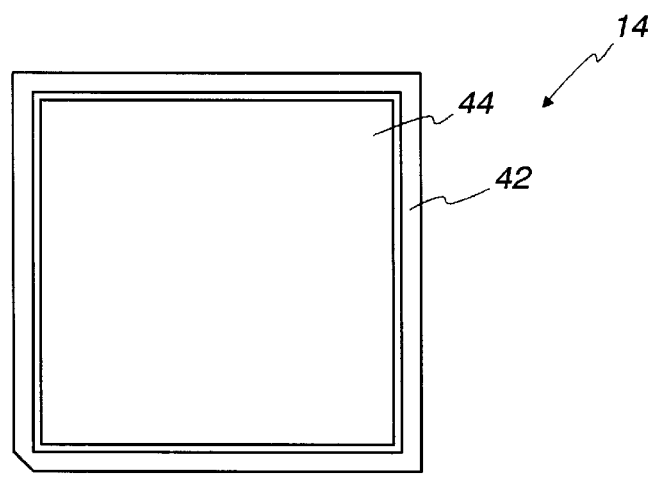
FIG. 8 is a top plan view of the carrier cover of FIG. 2.
Figure 9:
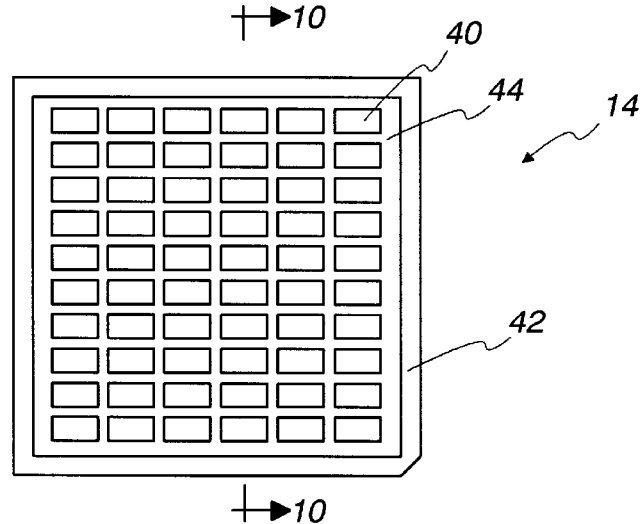
FIG. 9 is a bottom plan view of the carrier cover of FIG. 2.
Figure 10:
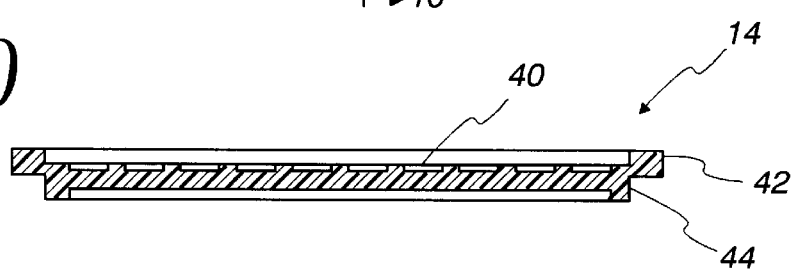
FIG. 10 is a cross-sectional view of the carrier cover, taken along the lines 10—10 of FIG. 9.
Figure 11:
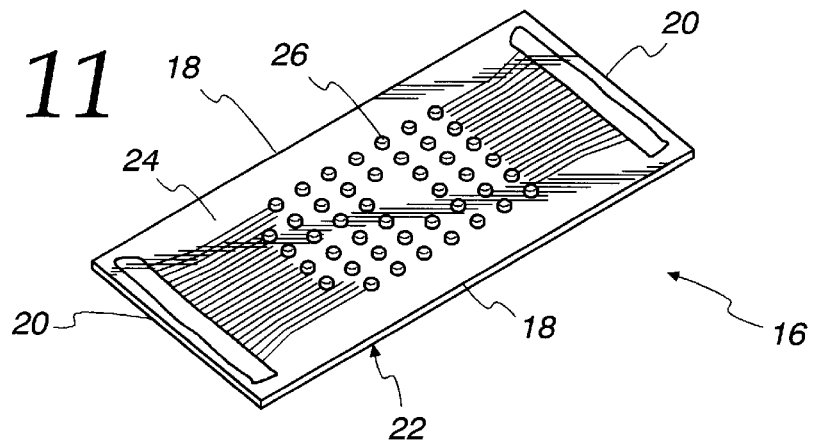
FIG. 11 is an enlarged perspective view of one of the μBGA packages.

Referring now in detail to the drawings, there is shown in FIG. 2 an improved μBGA carrier 10 which is constructed in accordance with the principles of the present invention. The μBGA carrier is comprised of a novel tray 12 and a flippable cover 14 for packing and shipping a plurality of micro ball grid array (μBGA) packages 16 and is specially adapted for facilitating the inspection of the solder balls on the bottom surfaces of the μBGA packages. The details of the carrier tray 12 are illustrated in FIGS. 3–7, and the details of the flippable carrier cover 14 are depicted in FIGS. 8–10. Each of the μBGA packages 16 (one of which is illustrated in detail in FIG. 11) is of a substantially rectangularly-shaped configuration and includes opposed side edges 18, opposed end edges 20, a top surface 22, and a bottom surface 24. The bottom surface 24 is provided with a plurality of solder balls 26 which are arranged in a matrix configuration. The μBGA package 16 may be similar to the type commercially available from Advanced Micro Devices, Inc. of Sunnyvale, Calif., under their part No. AM29LV800-120UAC. In this instance, the μBGA package 16 has forty-four solder balls 26 formed on its bottom surface 24.

With reference to FIGS. 2, and 3 through 7, the μBGA carrier tray 12 is of a substantially square-shaped configuration and has width and length dimensions of approximately 101.6 mm. The carrier tray 12 is formed with a plurality of individual compartments or pockets 28 which are arranged in a matrix of rows and columns. For example, the pockets 28 may be arranged into six rows and ten columns so as to pack or store sixty μBGA packages 16 therein. The carrier tray is of a single-piece construction and is preferably formed of a suitable plastic material such as polyethylene which may be fabricated by a conventional injection molding process. It should be noted that while the pockets 28 may have various width and dimensions, they are all made of the same size so as to conform to the contour of the μBGA packages 16 for storing a predetermined quantity thereof, for example, sixty.

As can be seen from FIGS. 3–7, the carrier tray includes a narrow ledge portion 30 and a centrally raised platform 32 surrounded on each side by the ledge portion 30. The plurality of pockets 28 are formed in the raised platform 32. Since all of the pockets 28 are identical in their construction, it will be sufficient to describe in detail only one of them. The pocket 28 is of a generally rectangularly-shaped configuration and has dimensions of about 11.07 mm in length and about 5.94 mm in width. The pocket is formed by opposed raised end support members 34a, 34b and a slightly stepped central portion 36 sandwiched between the support members. Further, the step portion 36 is formed with an aperture 38 disposed in its center. The step portion 36 has dimensions of approximately 6.86 mm (in length) and of approximately 5.08 mm (in width). The aperture 38 has dimensions of about 3.3 mm×2.54 mm.

In this manner, when the μBGA packages 16 are disposed in the individual pockets 28 of the carrier tray 12 only the bottom surface 24 adjacent the opposed end edges 20 of the μBGA packages 16 are supported by means of the opposed raised end support members 34a, 34b so that the solder balls 26 thereof on the bottom surface are suspended freely above the stepped portion 36. As a result, the solder balls 26 are substantially aligned over the aperture 38 and do not contact or engage with any part of the pocket 28. This can best be seen from FIG. 6. This serves to reduce the possibility of physical damage to the sensitive parts on the bottom surface portions of the μBGA packages 16. In addition, ventilation is provided to the μBGA packages 16 by the apertures 38, such as when the carrier tray 12 filled with the μBGA packages is placed into an oven for temperature testing.

With reference to FIGS. 2 and 8 through 10, the μBGA flippable carrier cover 14 is also of a substantially square-shaped construction and has likewise width and length dimensions of approximately 101.6 mm. The flippable carrier cover 14 is formed with a plurality of individual compartments or pockets 40 which are arranged in a matrix of rows and columns. For instance, the pockets 40 are formed into six rows and ten columns. The flippable carrier cover is of a single-piece construction and is also preferably formed of a suitable plastic material such as polyethylene which may be fabricated by a conventional injection molding process. Again, the pockets 40 are all made of the same size and conform to the contour of the μBGA packages.

As can be seen from FIG. 9, the carrier cover 14 includes a narrow raised lip portion 42 and a central cavity portion 44 surrounded on each side by the lip portion 42. The plurality of pockets 40 are formed in the central portion 44. Each of the pockets 40 is of a generally rectangular shape and has dimensions of about 11.07 mm in length and about 5.94 mm in width.

In use, a predetermined number of μBGA packages 16 (i.e., sixty) are loaded or packed into the corresponding pockets 28 of the carrier tray 12 so as to completely fill the same. As can best be seen from FIG. 6, it will be noted that the opposed raised end support members 34a, 34b contact or engage only the bottom surface 24 adjacent the opposed end edges 20 of the μBGA packages 16 so that the solder balls 26 on the bottom surface thereof are suspended freely above the stepped portion 36 and are substantially aligned over the aperture 38. With the carrier tray 12 being filled with μBGA packages, they may now be transported to and from various types of processing or manufacturing equipment for carrying out various manufacturing or assembly steps, such as assembling, marking, testing and inspection.

As part of the typical inspection process conducted at the manufacturer's site, the solder balls 26 on the bottom surface 24 of the μBGA packages 16 are visually inspected for compliance with quality standards. Unlike the prior art carrier trays in which each of the individual μBGA packages must be manipulated in order to inspect the solder balls on the bottom surface, the flippable carrier cover 14 of the present invention is used to flip over the plurality of μBGA packages 16 in the corresponding pockets 28 so as to facilitate the inspection of the solder balls 26. In particular, the flippable carrier cover 14 is disposed on top of and over the carrier tray 12 filled with the μBGA packages 16. As a consequence, the lip portion 42 of the carrier cover 14 will come to rest against the ledge portion 30 of the carrier tray 12 so that the cover pockets 40 will be vertically aligned with the tray pockets 28 having the μBGA packages 16 disposed therein.

Next, the carrier tray 12 and cover 14 will be turned over or flipped upside-down so that the μBGA packages 16 are disposed in the corresponding cover pockets 40 with the solder balls 26 facing upwardly. Then, the carrier tray 12 can be lifted away from the flippable carrier cover 14 so as to allow the solder balls 26 to be visually inspected (FIG. 2).

In order to place the μBGA packages 16 back into the tray pockets 28, the operations just described are performed in the reverse order. Therefore, when all of the remaining processing steps have been completed the carrier 10 is suitably transported from the chip manufacturer's site to an assembly station at a customer's site where further assembly operations can be performed. Therefore, the overall assembly operation has been greatly simplified and the packing cost of the μBGA packages 16 has been significantly reduced. It is also to be noted that the μBGA carrier 10, after it has been completely unloaded at the customer's site, can be reused since it is made of a durable plastic material.

From the foregoing detailed description, it can thus be seen that the present invention provides an improved μBGA carrier for packing and shipping of a plurality of μBGA packages and is specially adapted for facilitating the inspection of the solder balls on the bottom surfaces of the μBGA packages. The μBGA carrier of the present invention includes a tray member having a plurality of first pockets and a lid member having a plurality of second pockets. When the lid member is placed on top of the tray member, the second pockets are vertically aligned with corresponding ones of the first pockets in the tray member. Thereafter, the μBGA carrier can be flipped upside down so that when the tray member is removed the solder balls are facing upwardly to allow inspection of the same.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. A μBGA carrier for packing and shipping a plurality of μBGA packages, said μBGA carrier comprising in combination:

a substantially square-shaped tray member being formed of a ledge portion and a centrally raised platform surrounded on each side by said ledge portion;

a plurality μBGA packages, each of said plurality of μBGA packages including opposed side edges, opposed end edges, a ton surface, and a bottom surface, said bottom surface having a plurality of solder balls formed thereon;

said centrally raised platform having a plurality of first pockets disposed therein for packing and storing the plurality of μBGA packages;

each of said plurality of first pockets being dimensioned so as to conform to the contour of said μBGA packages;

each of said first Dockets including opposed raised end support members and a slightly stepped center portion sandwiched between said end support members;

said stepped center portion having a central aperture so as to provide ventilation to said μBGA packages;

said opposed end support members supporting only said bottom surface adjacent said opposed end edges of said μBGA package so that said solder balls are suspended freely above said stepped center portion;

said solder balls being substantially aligned over the central aperture in said stepped center portion;

a substantially square-shaped lid member being formed of a raised lip portion and a central cavity portion surrounded on each side by said lip portion;

said central cavity portion having a plurality of second pockets formed therein which are vertically aligned with corresponding ones of said plurality of first pockets in said tray member when said lid member is placed on top of said tray member and each of said plurality of second pockets being dimensioned so as to conform to the contour of said μBGA packages.

2. A μBGA carrier as claimed in claim 1, wherein each of said tray members and lid members is formed of a single-piece construction.

3. A μBGA carrier as claimed in claim 1, wherein each of said tray members and lid members is formed of a plastic material.

4. A μBGA carrier as claimed in claim 1, wherein said carrier is flipped upside-down so that when said tray member is removed the plurality of μBGA packages are disposed in said corresponding second pockets in said tray member with said solder balls facing upwardly, thereby facilitating inspection of the same.

* * * * *

UNITED STATES PATENT AND TRADEMARK OFFICE
CERTIFICATE OF CORRECTION

PATENT NO. : 5,848,702
DATED : December 15, 1998
INVENTOR(S) : Saragarvani Pakeriasamy It is certified that error appears in the above-indentified patent and that said Letters Patent is hereby corrected as shown below:

Column 6, line 3, change "ton" to -- top --.

Column 6, line 11, change "Dockets" to -- pockets --

Signed and Sealed this

Thirtieth Day of March, 1999

Attest:

Q. TODD DICKINSON

*Attesting Officer*  *Acting Commissioner of Patents and Trademarks*